United States Patent [19]
Ozimek et al.

[11] Patent Number: 5,222,293
[45] Date of Patent: Jun. 29, 1993

[54] SYSTEM FOR PLACING AN OBJECT ON A CARRIER AND METHOD

[75] Inventors: Edward J. Ozimek, Penfield; Clyde L. Fetterman, Webster, both of N.Y.

[73] Assignee: Eastman Kodak Company, Rochester, N.Y.

[21] Appl. No.: 872,472

[22] Filed: Apr. 23, 1992

[51] Int. Cl.$^5$ .................. H05K 3/30; B23D 19/00
[52] U.S. Cl. .................. 29/833; 29/834; 29/840; 29/407; 29/720; 29/743; 156/64; 156/378
[58] Field of Search ........... 29/407, 720, 721, 739, 29/740, 743, 759, 832, 833, 834, 836, 840; 156/64, 378, 358, 359, 364; 356/399, 400; 414/730, 737, 738

[56] References Cited

U.S. PATENT DOCUMENTS

| | | | |
|---|---|---|---|
| 4,283,845 | 8/1981 | Sigel et al. | 29/740 X |
| 4,959,898 | 10/1990 | Landman et al. | 29/720 X |
| 4,980,971 | 1/1991 | Bartschat | 29/759 X |

Primary Examiner—Timothy V. Eley
Attorney, Agent, or Firm—Stephen C. Kaufman

[57] ABSTRACT

A system, including a method and cognate apparatus, places an object on a carrier with great accuracy. Three prepositioned pins on a holder engage a corner portion of the carrier formed between adjacent side edges of the carrier to provide the corner in a predetermined fixed relation to the stops. Two prepositioned spaced target points at predetermined locations on the object are aligned in a predetermined orientation with the pins and thus with the adjacent side edges of the carrier, enabling the object to be placed on the carrier in precise manner. A sensing and placing mechanism, such as a camera, vision system and micropositioning table, senses the pin positions on the holder and target point positions on the object. The object is placed on the carrier in dependence upon the sensed pin and target point positions such that each target point is in a preselected position relative to the pins and pin engaged corner of the carrier.

14 Claims, 2 Drawing Sheets

SYSTEM FOR PLACING AN OBJECT ON A CARRIER AND METHOD

CROSS-REFERENCE TO RELATED PATENT APPLICATIONS

This patent application is related to:

(1) U.S. patent application Ser. No. 702,867, filed May 20, 1991 E. J. Ozimek, J. L. Suess and E. Carnall), which has a common assignee and one common inventor with this application, and which is entitled "METHOD AND APPARATUS FOR TRANSFERRING BONDING MEDIUM TO A SUBSTRATE";

(2) U.S. patent application Ser. No. 702,868, filed May 20, 1991 D. Freeman), which has a common assignee with this application, and which is entitled "APPARATUS FOR CONTROLLING ASSEMBLY FORCE"; and (3) U.S. patent application Ser. No. 702,877, filed May 20, 1991 E. Carnall and E. J. Ozimek), which has a common assignee and one common inventor with this application, and which is entitled "METHOD AND APPARATUS FOR CURING AN ADHESIVE INTERFACE".

FIELD OF THE INVENTION

This invention relates to a system including a method and apparatus for placing an object on a carrier, and more particularly for placing a semiconductor device on a ceramic substrate assembly.

BACKGROUND OF THE INVENTION

Arrangements are known for aligning one component relative to another such as for placing an object on a carrier, e.g., in assembling one electrical or electronic component on another. Examples of such arrangements are shown in the following prior art.

U.S. Pat. No. 4,880,308 (Shirasu), issued Nov. 14, 1989, discloses an aligning system to position a semiconductor wafer relative to a mask, for an exposure operation. Images of marks on the mask are projected onto the wafer lying on a table, movable in X and Y linear directions and theta rotational direction under the control of a mark detecting optical system, to align the wafer marks with the images. The wafer is disposed on the table without reference to any wafer edge engaging positioning structure for locating the wafer in a predetermined fixed relation thereto.

U.S. Pat. No. 4,861,162 (Ina), issued Aug. 29, 1989, discloses an aligning system to position respective chip regions of a semiconductor wafer, held on a chuck lying on a movable stage, for an exposure operation. The wafer is held on the chuck so that marks thereon for each region are in a predetermined relation to marks on the chuck. A mark detecting optical system aligns each region via an optical mark. The wafer is disposed on the chuck without reference to any wafer edge engaging positioning structure for locating the wafer in a predetermined fixed relation thereto.

U.S. Pat. No. 4,980,971 (Bartschat et al.), issued Jan. 1, 1991, discloses an aligning system using two cameras, a machine vision system and a robot arm, movable in X, Y and Z linear directions and theta rotational direction, to place a semiconductor chip on a substrate held on a chuck, to register chip solder bumps with substrate solder bumps. One camera registers with each of a pair of substrate datum points to locate the substrate in one frame of reference, and the other camera registers with each of a pair of chip datum points to locate the chip in another frame of reference. Based thereon, the vision system controls the robot arm to place the substrate on the chuck and then the chip on the substrate to register the pairs of datum points and thus the solder bumps. The substrate is disposed on the chuck without reference to any substrate edge engaging positioning structure for locating the substrate in a predetermined fixed relation thereto.

U.S. Pat. No. 4,755,053 (Levinson et al.), issued Jul. 5, 1988, discloses an aligning system using an optical device, a machine vision system and a tri-axis alignment stage, movable in X and Y linear directions and theta rotational direction, to position a plate on a substrate so that a pair of plate holes coincide with a pair of substrate targets. Using the optical device, the vision system establishes a pair of coordinate axes X and Y for the target centers and a pair of coordinate axes X and Y for the hole centers, performs a transformation of coordinates and computes the X, Y and theta motions of the tri-axis stage required to move the part disposed thereon relative to the other part otherwise disposed, for coinciding the target and hole centers. The vision system uses known algorithms to find the target and hole centers, and obviously to establish the coordinate axes, transform the coordinates and compute the tri-axis stage motions required. The manner of disposing the substrate and plate on the respective supports supporting them for alignment is not disclosed.

U.S. Pat. No. 4,283,845 (Sigel et al.), issued Aug. 18, 1981, discloses a positioning system to lay down two electronic articles in two predetermined article locations on a carrier. The carrier is placed against three first upright rollers defining a first reference system on a reference surface, so as to define three edge contact points on the carrier registering with the rollers and thereby the positional relation thereto of the two article locations. The articles are positioned above three second upright rollers defining a second reference system, identical to the first reference system, on a plate of a positioning machine, so as to register the articles with the article locations of the second reference system. The carrier is then placed against the second rollers on the plate, and the articles are laid thereon at the article locations of the second reference system. No vision system is disclosed nor any detectable marks on the articles or carrier for vision system use to achieve alignment in relation to the rollers of either reference system.

In certain arrangements of the above type, an object such as a semiconductor device (silicon die, chip) is placed in a precise location on a carrier such as a ceramic substrate for bonding thereto. Typically, curable adhesive is predeposited in lines or dots on the carrier top surface, and the object underside is laid on the adhesive in desired relation to the carrier. The assembled unit is placed in a heating zone (oven) for adhesive curing.

The object may have disposed thereon discrete components of very small size, e.g., 5 to 15 microns in width (diameter). For instance, the object may contain a predetermined array of discrete active pixel imaging elements, e.g., photodiodes, of such small size, which are desired to be located at precise positions relative to the carrier when the object is placed on the carrier. This is significant where the assembled object and carrier unit is to be placed on a further support such as an electronic member (fixture) with the discrete components on the object located at desired precise positions relative to the further support. However, the known arrangements are generally incapable of repeatably achieving high precision positioning within a tolerance of less than the width (diameter) of such a small size component.

It is desirable to have a system for placing an object on a carrier with repeatable high precision, particularly within a tolerance of less than the width size of such a discrete component, e.g., within a tolerance of ±2 to 3 or 2 to 4 microns.

SUMMARY OF THE INVENTION

The foregoing drawbacks are obviated in accordance with the present invention by providing a system for repeatable high precision placing of an object on a carrier, particularly within a tolerance of less than about ±2 to 3 or 2 to 4 microns.

According to one aspect of the invention, a method is provided for placing an object on a carrier by particular steps. The method comprises providing (a) a carrier with peripheral edge portions defining an alignment portion, (b) a holder with prepositioned spaced apart stationary stops defining a positioning structure for engaging the alignment portion so that the alignment portion engages the stops to provide the carrier in a predetermined fixed relation to the stops, and (c) an object with spaced apart target points prepositioned at predetermined locations thereon. The method further comprises disposing the carrier on the holder so that the alignment portion engages the stops to provide the carrier in said predetermined fixed relation to the stops, sensing the positions of the stops on the holder and the positions of the target points on the object, and placing the object on the carrier in dependence upon the sensed stop positions and sensed target point positions so that the target points are each in a preselected position relative to the stops and the stop engaged alignment portion.

In one illustrative example, the object is a semiconductor device with two spaced apart target points and an image sensor comprising a predetermined array of active pixel imaging elements including a first imaging element positioned at a predetermined location relative to the target points. The-carrier is a ceramic substrate assembly with peripheral edge portions including adjacent first and second edges defining an alignment corner therebetween. The stops comprise three stationary pins defining a cornering structure for engaging the alignment corner so that when the corner engages the pins and the device is placed on the substrate assembly, the target points and first imaging element are each in a preselected position relative to the pins and the corner defining edges.

The substrate assembly may be a multilayer assembly having a top layer with peripheral edges independent of the peripheral edges of the remaining layers therebelow, and the pins may have a corresponding top layer engaging shank portion and may be recessed along the shank portions thereof adjacent the remaining layers of the assembly. In this way, the top layer engaging shank portions of the pins engage the top layer peripheral edges while the recessed shank portions of the pins prevent engagement thereof with the peripheral edges of the remaining layers.

The method may be carried out by establishing a carrier coordinate system defining a carrier frame of reference relative to the sensed stop positions and the stop engaged alignment portion, and establishing an object coordinate system defining an object frame of reference relative to the sensed target point positions. By effecting a transformation of coordinates correlating the object coordinate system to the carrier coordinate system, the object is located within the carrier frame of reference. It is then placed on the carrier according to the transformation of coordinates so that the target points are in said preselected position relative to the stops and stop engaged alignment portion.

According to another aspect of the invention, a cognate apparatus is provided for placing the object on the carrier, the apparatus comprising a holder, and sensing and placing means.

The holder is adapted to dispose thereon the carrier with said edge portions defining the alignment portion. The holder has said prepositioned spaced apart stationary stops defining a positioning structure for engaging the alignment portion to provide the carrier in said predetermined fixed relation to the stops for placing thereon the object with said target points.

The sensing and placing means comprise means for sensing the positions of the stops on the holder and of the target points on the object, and means for placing the object on the carrier in dependence upon the sensed positions of the stops and target points so that the target points are each in said preselected position relative to the stops and stop engaged alignment portion.

The sensing and placing means may comprise means for optically sensing the stop and target point positions, means for establishing said coordinate systems and effecting said transformation of coordinates, and means for placing the object on the carrier according to said transformation of coordinates so that the target points are in said preselected position relative to the stops and stop engaged alignment portion.

In one illustrative example, the stops comprise three stationary pins. Each may be an upright pin with a lower end affixed to the holder, an upper free end and a shank extending between the ends. By recessing a portion of each shank at a predetermined location spaced a predetermined distance from the upper end, the pins can precisely position the carrier at their upper ends.

The invention will be more readily understood from the following detailed description taken with the accompanying drawings and claims.

It is noted that the drawings are not to scale, some portions being shown exaggerated to make the drawings easier to understand.

DETAILED DESCRIPTION

Referring now to FIGS. 1 to 7, there is shown an apparatus 10 for placing a plurality of objects 11 on corresponding carriers 12 in accordance with an embodiment of the invention.

Assembly 10 is variously shown with objects 11, carriers 12, a holder 13, stops (pins) 14, a sensing and placing assembly 15, a camera 16, a machine vision system 17, a micropositioning table arrangement 18, a linear displacement table 19, a beam 20, base and free ends 21 and 22, a vertical displacement mechanism 23, a rotational displacement table 24, an arrow 25, a holder support 26, adhesive dots 27, a substrate assembly 30, top, middle and bottom layers 31, 32 and 33, a window 34, conductors 35, longitudinal edges 36 and 37, lateral edges 38 and 39, an alignment corner 40, a carrier center point 41, stop center points 42, a corner apex 43, a stop radius 44, middle and bottom layer peripheral edges 45 and 46, stop recesses 47, target points 51 and 52, an array 53 of imaging elements including imaging elements 54, 55, 56 and 57, an object peripheral edge 58, an object center point 59, a mounting plate 61, driven and floating plates 62 and 63, leaf springs 64 and 65, a collet assembly 66, a suction fixture 67, a suction passage 68, a motor 69, a sensor 70, a mounting arm 71, and a sensor target 72.

Except for the construction and arrangement of stops (pins) 14 on holder 13 and target points 51 and 52 on objects 11, according to the invention, apparatus 10 generally comprises an assembly corresponding to that disclosed in (1) said U.S. patent application Ser. No. 702,867 E. J. Ozimek, J. L. Suess and E. Carnall), entitled "METHOD AND APPARATUS FOR TRANSFERRING BONDING MEDIUM TO A SUBSTRATE"; (2) said U.S. patent application Ser. No. 702,868, D. Freeman), entitled "APPARATUS FOR CONTROLLING ASSEMBLY FORCE"; and (3) said U.S. patent application Ser. No. 702,877 E. Carnall and E. J. Ozimek), entitled "METHOD AND APPARATUS FOR CURING AN ADHESIVE INTERFACE".

Figure 1:
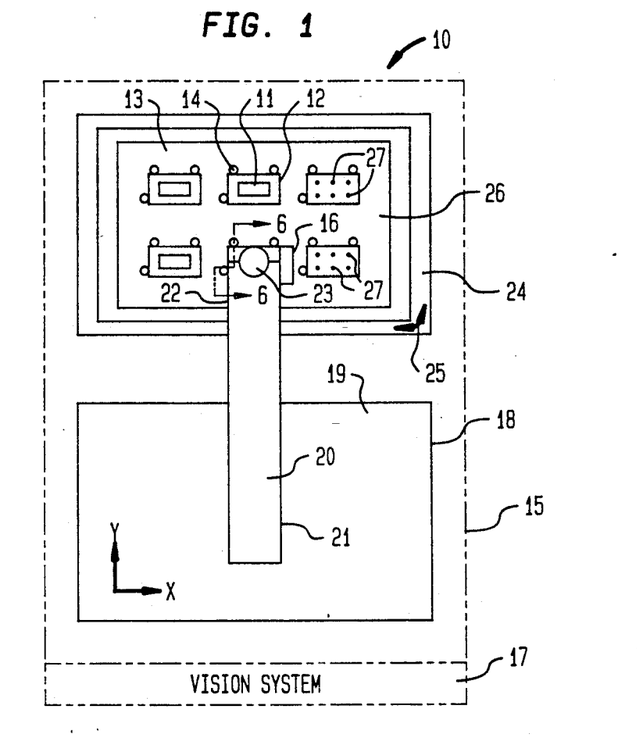
FIG. 1 is a top view of an apparatus for placing objects on corresponding carriers disposed against associated sets of stops on a holder, in a sensing and placing assembly in accordance with an embodiment of the invention.

Referring now to FIG. 1, apparatus 10 contains sensing and placing assembly 15 (shown in dashed line) which includes camera 16, machine vision system 17 (shown in dashed line) and micropositioning table arrangement 18, operatively coupled for conjoint operation. An example of assembly 15 is a Three Stage Micropositioning Table available from Kensington Corp. coupled with a Daedel Linear Stage/Compumotor Drive available from Daedel Corp.

Table arrangement 18 includes linear displacement table (linear stage) 19 for X and Y direction (horizontal) movement, and rotational displacement table (rotational stage) 24 for theta rotational direction movement as shown by dual headed arrow 25. Beam 20 is coupled for common movement with linear stage 19, having a base end 21 affixed to linear stage 19 and a free end 22 carrying camera 16 and vertical displacement mechanism (vertical mechanism) 23 for Z direction (vertical) movement. Each of the axes or movement directions X, Y and Z of table arrangement 18 is perpendicular to the others to provide a Cartesian coordinate system.

Vertical mechanism 23 places each object 11 on an associated carrier 12 disposed against an associated set of stops 14 on holder 13. Each carrier 12 typically has predeposited curable adhesive dots 27 for bonding to the object 11 placed thereon by vertical mechanism 23. Holder 13 is situated on holder support 26 located on rotational stage 24.

In effect, camera 16 senses the position of each carrier 12, e.g., an electronic component such as ceramic substrate assembly 30, relative to its set of stops 14 on holder 13, e.g., a pallet, situated on rotational stage 24. It also senses the positions of target points 51 and 52 (FIG. 2) on the associated object 11, e.g., an electronic component such as a semiconductor device, for placing the object on the carrier. Vision system 17 is programmed to process the signal input from camera 16 to control the motions of table arrangement 18 for the required positioning in known manner.

Figure 2:
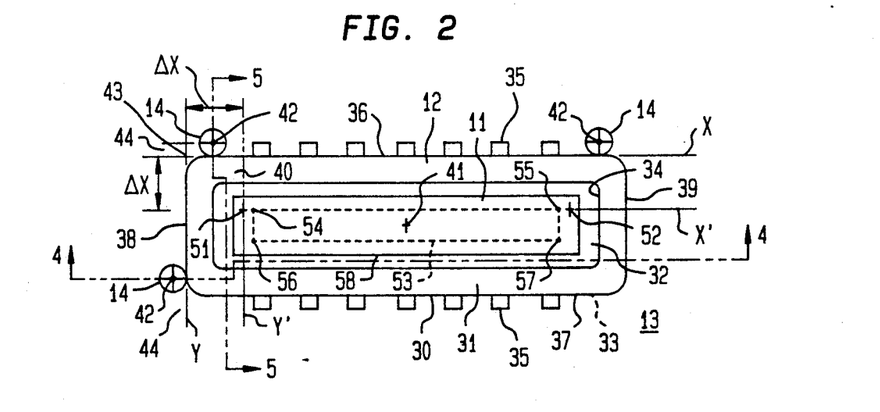
FIG. 2 is an enlarged top view of an object as placed on a carrier disposed against a set of stops of the apparatus of FIG. 1.

Referring now to FIG. 2, there is shown a top view of a multilayer ceramic substrate assembly 30 with a top ceramic layer 31, middle metal (metallic) layer 32 and bottom ceramic layer 33. Assembly 30 is one illustrative example of the carrier 12 of FIG. 1. Top layer 31 has a central window 34 exposing the central portion of middle layer 32 on which the associated object 11 is placed to form an assembled unit. Conductors (legs) 35 extend from middle layer 32 for electrical connection to external components (not shown).

Top layer 31 has an upper longitudinal peripheral edge 36 defining an X coordinate axis, a lower longitudinal peripheral edge 37 generally parallel to upper edge 36, a left lateral peripheral edge 38 perpendicular to upper edge 36 and defining a Y coordinate axis perpendicular to the X axis, and a right lateral peripheral edge 39 generally parallel to left edge 38. Upper edge 36 and left edge 38 precisely define an alignment corner 40 therebetween. The geometrical center of carrier 12 within the perimetric edges 36, 37, 38 and 39 of top layer 31 is defined by center point 41.

Holder 13 is shown with stops 14 in the form of three spaced apart stationary pins having center points 42. Pins 14 are affixed to holder 13 in predetermined positions to define a positioning structure for engaging corner 40 of carrier 12. A first pin 14 is prepositioned to engage left edge 38 of top layer 31, and second and third pins 14 are prepositioned to engage upper edge 36 of top layer 31 at spaced apart points therealong. Corner 40, as defined by upper edge 36 and left edge 38, thus engages pins 14 to provide carrier 12 in a predetermined fixed positional relation to all three pins 14 and their center points 42.

In this orientation, the apex 43 of corner 40, which represents the intersection of the X and Y coordinate axes coincident with upper and left edges 36 and 38, is precisely positioned relative to pin center points 42. Upper and left edges 36 and 38, and axes X and Y, are spaced from pin center points 42 by a distance 44 corresponding to the radius of pins 14.

Figure 4:
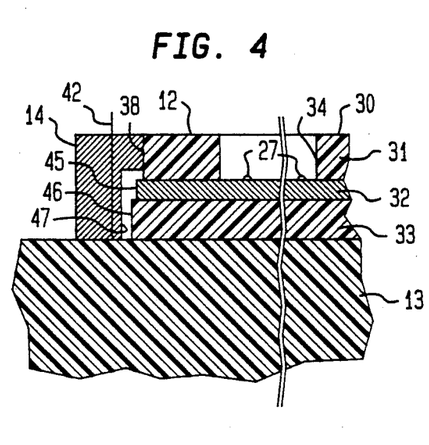
FIG. 4 is a partial longitudinal side sectional view taken along line 4—4 of FIG. 2, but with the object omitted.
Figure 5:
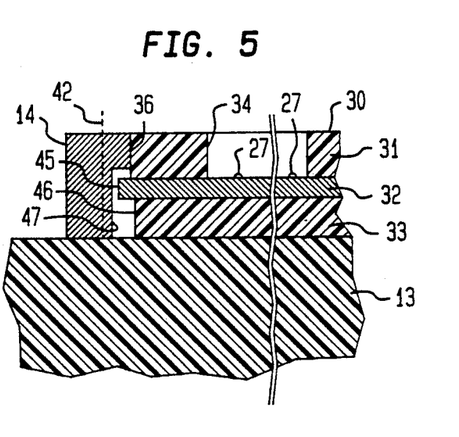
FIG. 5 is a partial lateral side view similar to FIG. 4 taken along line 5—5 of FIG. 2.

Referring now to FIGS. 4 and 5, there is shown a partial longitudinal side views taken through lines 4—4 and 5—5, respectively, of FIG. 2, but with the object 11 omitted. Edges 36, 37, 38 and 39 of top layer 31 of assembly 30 may not register precisely with the corresponding portions of peripheral edge 45 of middle layer 32 and of peripheral edge 46 of bottom layer 33, that form carrier 12. Since corner 40, defined by upper edge 36 and left edge 38 of top layer 31, is conveniently used as reference for positioning carrier 12 on holder 13 via pins 14, each pin 14 is suitably provided as an upright pin on holder 13 with a recess 47 defined in the shank portion thereof extending between its lower end affixed to holder 13 and its upper free end.

Each recess 47 is disposed at a predetermined location along the shank spaced a preselected distance from the upper end of the pin 14. In this way, any uneven portions of the middle layer peripheral edge 45 and bottom layer peripheral edge 46 will be accommodated in the recess 47 of the adjacent pin 14, so as to permit the upper end portion of each pin 14 to engage upper edge 36 or left edge 38 of top layer 31 in unhindered and precise manner.

Figure 3:
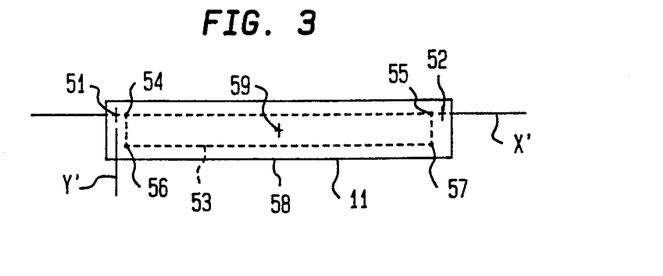
FIG. 3 is a top view of the object before being placed on the carrier as shown in FIG. 2.

Referring now to FIG. 3, an object 11 is shown as a semiconductor device (silicon die, chip) with left and right spaced apart target points 51 and 52 prepositioned at predetermined locations thereon. Object 11 also has a prepositioned, e.g., rectangular, array 53 of individual discrete active pixel imaging elements (shown in dashed line), including left and right upper corner imaging elements 54 and 55, and left and right lower corner imaging elements 56 and 57. Array 53 is suitably positioned in a preselected location relative to the adjacent portions of peripheral edge 58 of object 11. The geometrical center of object 11 within perimetric edge 58 is defined by center point 59.

As is clear from FIG. 3, an imaginary longitudinal line intersecting the centers of target points 51 and 52 defines an X' coordinate axis, and an imaginary lateral line intersecting the center of the left target point 51 and extending perpendicular to the longitudinal line forms a corresponding Y' coordinate axis. An object coordinate system, per axes X' and Y' at right angles to each other, is thereby provided which defines an object frame of reference relative to the positions of the target points 51 and 52.

Referring again to FIG. 2, it is seen that object 11 is placed in a precise position on carrier 12, so that each of target points 51 and 52, and each discrete imaging element of array 53, as exemplified by corner imaging elements 54, 55, 56 and 57, and particularly imaging element 54 as first imaging element, is in a preselected location relative to corner 40 and its apex 43, as well as to the center point 42 of each pin 14. Object 11 and carrier 12 may be sized so that object center point 59 coincides with carrier center point 41 when object 11 is so placed on carrier 12.

Figure 6:
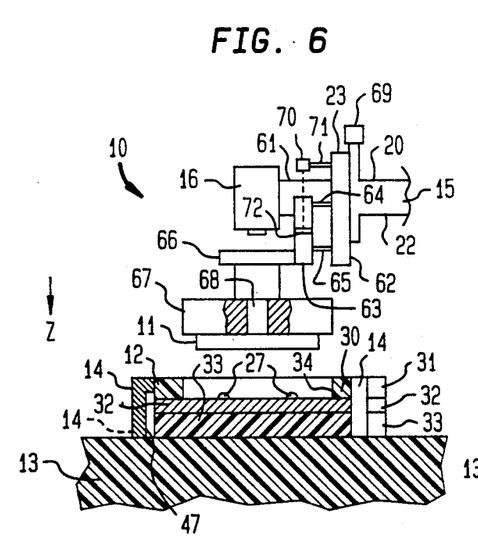
FIG. 6 is a partial lateral side sectional view taken along line 6—6 of FIG. 1, showing the object held by a mechanism of the sensing and placing assembly prior to placing the object on the carrier as shown in FIG. 2.
Figure 7:
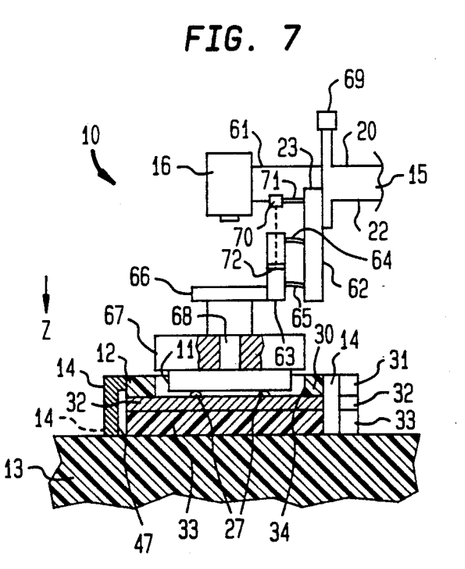
FIG. 7 is a view similar to FIG. 6 and shows the object as it is placed on the carrier as shown in FIG. 2.

Referring now to FIGS. 6 and 7, there are shown partial lateral side sectional views taken along a line 6—6 of FIG. 1 showing the object 11 held by a mechanism of the sensing and placing assembly 15 prior to placing the object on the carrier as shown in FIG. 2, and a similar view showing the object 11 as it is placed on the carrier 12 as shown in FIG. 2. The free end 22 of beam 20 carrying camera 16 and vertical mechanism 23 is shown in overlying relation to a portion of holder 13, which as shown in FIG. 1 is located on holder support 26 disposed on rotational stage 24. Also shown is a set of three pins 14 engaged by an associated carrier 12. Camera 16 is fixed to beam 20 by mounting plate 61. Vertical mechanism 23 includes driven plate 62 mounted on beam 20 for vertical movement relative thereto in the Z direction. Floating plate 63 is mounted on driven plate 62 via two vertically spaced apart horizontal leaf springs 64 and 65 which maintain plates 62 and 63 parallel to each other, essentially preventing X and Y direction motion between the plates. Floating plate 63 carries collet assembly 66 formed of suction fixture (collet) 67 having suction passage 68 for applying suction in known manner to hold thereon the object 11 to be placed on the given carrier 12.

Drive motor 69, operatively coupled to driven plate 62 by suitable gearing (not shown), vertically displaces driven plate 62 in the Z direction to lower fixture 67 for placing object 11 on carrier 12. This occurs after positioning beam 20 by X and Y direction movement of linear stage 19, and carrier 12 by theta direction movement of rotational stage 24, as may be required to correlate (align) the carrier X and Y coordinate axes and object X' and Y' coordinate axes with each other and with the axes or movement directions X and Y of table arrangement 18.

The lowering movement of fixture 67 is controlled by distance sensor 70 which is operatively coupled to drive motor 69. Sensor 70 is mounted by arm 71 on driven plate 62 and optically senses the distance therefrom of reflecting target 72 disposed on floating plate 63. An example of optical distance sensor 70 is a Keyence PT-A170 Optical Positioning Sensor.

Initially, each carrier 12 is placed, e.g., manually, on holder 13 so that upper and left edges 36 and 38 of top layer 31 contact the upper ends of the associated pins 14. Adhesive dots 27, e.g., of electrically conductive material, may be preapplied to the top surface of middle layer 32 within the exposed area bounded by window 34 of top layer 31, or may be applied thereto after placing the carriers 12 on holder 13 in contact with their pins 14.

Adhesive dots 27 may be applied to carriers 12 as disclosed in said U.S. patent application Ser. No. 702,867, E. J. Ozimek, J. L. Suess and E. Carnall), entitled "METHOD AND APPARATUS FOR TRANSFERRING BONDING MEDIUM TO A SUBSTRATE".

Objects 11 may be initially placed at sites on holder 13, e.g. adjacent their associated carriers 12, or may be located at a remote separate site. In either case, linear stage 19 moves beam 20 to locate camera 16 for sensing the position of each of the three pins 14 for a given carrier 12 in abutment therewith (FIG. 2), and separately to locate camera 16 for sensing the position of each of the two target points 51 and 52 on an associated object 11 (FIG. 3). The corresponding sensing signals generated by camera 16 are processed in conventional manner by vision system 17.

This signal processing is effected in accordance with known algorithms to establish a carrier coordinate system, per axes X and Y at right angles to each other (FIG. 2), defining a carrier frame of reference relative to the sensed pin 14 positions and the corner 40 engaged by such pins. It is also effected to establish an object coordinate system, per axes X' and Y' at right angles to each other (FIG. 3), defining an object frame of reference relative to the sensed positions of the target points 51 and 52.

During this sensing and processing, rotational stage 24 may be moved in either theta direction of arrow 25, under the control of vision system 17, as may be required. This movement may be needed to correlate (align) the X axis and coincident upper longitudinal edge 36 of carrier 12, and thus the two pins 14 in contact therewith, and the Y axis and coincident left lateral edge 38 of the carrier 12, and thus the left lateral side pin 14 in contact therewith, correspondingly with the X' and Y' axes of object 11, and thus with each of target points 51 and 52, as well as with the X and Y movement directions of linear stage 19 (FIG. 1).

Vision system 17 then effects in known manner a transformation of coordinates correlating the object X' and Y' coordinate system to the carrier X and Y coordinate system, in effect overlaying the X' and Y' object coordinate system on the X and Y carrier coordinate system as shown in FIG. 2. The transformation of coordinates typically results in an offset of the object X' and Y' coordinate axes relative to the carrier X and Y coordinate axes.

For example, as viewed in FIG. 2, object ordinate axis Y' may be displaced a horizontal distance delta X along carrier abscissa axis X to the right of carrier ordinate axis Y, i.e., in a direction from left edge 37 to right edge 38, and object abscissa axis X' may be displaced a vertical distance delta Y along carrier ordinate axis Y downwardly of carrier abscissa axis X, i.e., in a direction from upper edge 36 to lower edge 37. Each of target points 51 and 52, and thus each imaging element of array 53, e.g., first imaging element 54, is precisely located by vision system 17 in a preselected positional orientation and relation to each pin 14 and thus to carrier corner 40 and upper and left edges 36 and 38.

Specifically, the carrier X and Y coordinate system precisely locates the position and orientation of each of the three pins 14 in a given set and thus the corner 40 and longitudinal and lateral edges 36 and 38 of the associated carrier 12. The coordinate transformation in turn precisely locates the object X' and Y' coordinate system in the context of the carrier X and Y coordinate system, and thus the positions of target points 51 and 52, and especially the individual imaging elements 54, 55, 56 and 57 of array 53, on the associated object 11 relative to carrier corner 40 and longitudinal and lateral edges 36 and 38 that meet at apex 43.

Since the positions of the three pins 14 of each set are predetermined, and the configuration of longitudinal and lateral edges 36 and 38, and thus of the position of apex 43 at corner 40, are known, the carrier X and Y coordinate system provides a very precise frame of reference definition. Since the positions of target points 51 and 52, and those of image elements 54, 55, 56 and 57 of array 53, are predetermined, the object X' and Y' coordinate system also provides a very precise frame of reference definition.

In essence, camera 16 senses the cross section of each pin 14 and vision system 17 determines its center point 42 and establishes the center point position relative to the carrier frame of reference. As the cross section and predetermined position of each pin 14 as well as its radius 44 are known, vision system 17 is programmed in conventional manner to compensate for the radius 44 distance spacing of the pin center point 42 from the adjacent edge 36 or 38, as the case may be, of carrier 12 in contact with the given pin 14 to provide very precise positioning accuracy.

As the positions of target points 51 and 52 relative to imaging elements 54, 55, 56 and 57 of array 53 are also known, vision system 17 is programmed in conventional manner to perform the transformation of coordinates for placing the object 11 on the associated carrier 12 in dependence upon the sensed positions of the three pins 14 and sensed positions of the two target points 51 and 52 so that the target points, and thus imaging elements 54, 55, 56 and 57 of array 53, are each in a desired preselected position relative to pins 14 and carrier corner 40.

Beam 20 on linear stage 19 is controlled by vision system 17 to move vertical mechanism 23 to the site at which a given object 11 is located (FIG. 3) for sensing by camera 16 and, in dependence upon the established transformation of coordinates, for pick up and transport of the object to a position overlying the associated carrier 12 on holder 13 (FIG. 6) for placing it on the carrier in the precise position established by vision system 17 (FIG. 7).

For this purpose, vertical mechanism 23 has collet assembly 66 including suction fixture 67 and its suction passage 68. As driven plate 62 and its leaf spring attached floating plate 63 move downwardly relative to beam free end 22 under the action of motor 69, collet assembly 66 is lowered to place fixture 67 in contact with the upper surface of the given object 11 under the resilient force of leaf springs 64 and 65. Suction from a source (not shown) applied via passage 68 to fixture 67 enables it, when precisely positioned over the object 11, to pick up the object for transport to a precise position overlying the associated carrier 12 on holder 13 (FIG. 6), via appropriate movement of linear stage 19 under the control of vision system 17.

In the event the overlying object 11 is not precisely aligned with the associated carrier 12 engaged against its associated set of pins 14, i.e., so that the X' coordinate axis line connecting target points 51 and 52 is precisely parallel to the X coordinate axis and precisely perpendicular to the Y coordinate axis as shown in FIG. 2, as sensed by camera 16, rotational stage 24 is moved in the appropriate theta direction under the control of vision system 17 to assure the desired precise alignment shown in FIG. 2.

When the object 11 is precisely aligned with the carrier 12, as desired, fixture 67 is lowered via operation of motor 69 to place the object on the adhesive dots 27 under the resilient force of leaf springs 64 and 65 (FIG. 7). The force of fixture 67 used to place the object 11 on the adhesive dots 27 is precisely controlled by use of sensor 70 on driven plate 62 in conjunction with sensor target 72 on floating plate 63 in combination with the resiliency (thickness and material characteristics) of leaf springs 64 and 65.

Specifically, when the object 11 contacts the adhesive dots 27, fixture 67 and sensor target 72 cease to move while driven plate 62 and sensor 70 continue to move, reducing the distance between sensor 70 and sensor target 72 and causing leaf springs 64 and 65 to bend and exert slight controlled force on the object in contact with the adhesive dots. When the decreasing distance between sensor 70 and sensor target 72 reaches a predetermined threshold, corresponding to a predetermined threshold force, sensor 70 operates to deenergize motor 69.

An arrangement for controlling such force is disclosed in said U.S. patent application Ser. No. 702,867 D. Freeman), entitled "APPARATUS FOR CONTROLLING ASSEMBLY FORCE".

Once the objects 11 are all placed on their associated carriers 12, as described, the assembled units may be further processed, such by oven curing the adhesive as disclosed in said U.S. patent application Ser. No. 702,877 E. Carnall and E. J. Ozimek), entitled "METHOD AND APPARATUS FOR CURING AN ADHESIVE INTERFACE".

Target points 51 and 52 are efficiently provided on object 11 during formation of the primary components thereon, such as by forming them simultaneously with the imaging elements of array 53. This may be effected by providing the target points on the same mask set used to form the photodiode imaging elements, e.g., by known photographic and mask processing technique. These imaging elements (photodiodes) are typically of very small size such as in a range of about 5 to 15, or 5 to 9, microns in width (diameter). The known technique enables them to be located at precisely spaced apart intervals in array 53 on object 11, and thus equally enables target points 51 and 52 to be precisely located on object 11 within the same degree of accuracy as the imaging elements, yet at known locations on object 11 remote from array 53 (FIG. 3).

By using three pins 14 of known cross section, e.g., 0.050 inch diameter, and preferably precisely ground, at known positions on holder 13 to define a positioning structure for the upper and left edges 36 and 38 defining corner 40 and apex 43 of the associated carrier 12 engaged thereby; the position and orientation of edges 36 and 38 are accurately automatically also known when camera 16 senses the pin center points 42. The camera sensed target points 51 and 52, which are also of known cross section, e.g., approximately 0.005 inch diameter, and themselves at known positions on the object 11 in relation to each imaging element of array 53, as exemplified by corner imaging elements 54, 55, 56 and 57, are thus enabled to be positioned accurately relative to the edges 36 and 38, when the object is placed on the carrier. This assures that the imaging elements, e.g., corner imaging elements 54, 55, 56 and 57, will automatically be located accurately relative to edges 36 and 38 on placing the object on the carrier.

The assembled object and carrier unit can then be assembled on a further carrier (fixture) so as to retain the precise positional relation of the imaging elements of array 53 relative to analogous upper and left edges of the wafer. This is useful where the wafer has a like set of three pins, analogous to pins 14 on holder 13, and duplicating their arrangement and positioning. Engaging edges 36 and 38 of carrier 12 against the duplicate set of pins on the wafer, e.g., by a known "drop-in" procedure, will automatically locate the image elements of array 53 on object 11 in like precise manner relative to the analogous upper and left edges of the wafer, e.g., to form a package assembly.

Due to the very precise results obtained with the system of the invention, based on the use and sensing of predetermined position pins 14 and target points 51 and 52, as above discussed, array 53 on object 11 may be located relative to carrier 12, and particularly corner imaging elements 54, 55, 56 and 57 relative to upper edge 36 and left edge 38, within a positioning accuracy of about ±2 to 4, or 2 to 3, microns. Where the imaging elements (photodiodes) are of a size of about 5 to 9 microns in width (diameter), such positioning-accuracy roughly corresponds to about one half of the width (diameter) of such an imaging element.

This high degree of positioning accuracy is enhanced by use of shank recesses 47 in pins 14 in the case of a carrier 12 formed as a multilayer assembly 30, in which the various layers are not always aligned precisely in superimposed stacked relation. The upper end portions of the pins 14 accurately contact the upper and left edges 36 and 38 of the top layer 31 of assembly 30 to assure the desired positioning accuracy, while the recesses 47 prevent contact of the pin shank portions, that are disposed below their upper end portions, with the adjacent (uneven) peripheral edge portions of the remaining assembly layers below its top layer.

As the system of the invention achieves repeatable precise positioning of the objects 11 on their associated carriers 12 in dependence upon the positional referencing integrity of the sensed pins 14 and target points 51 and 52, i.e., without the need for additional positioning adjustment, the degree of accuracy obtained, in positioning the object 11 within the carrier coordinate system frame of reference consequent the transformation of coordinates, is only limited by the stepping accuracy of table arrangement 18. The high accuracy results are achieved without regard to the general condition of the object 11 or carrier 12, and only require properly located holder pins 14 and object target points 51 and 52 plus suitable carrier upper and left lateral edges 36 and 38 as accurate reference edges for appropriate pin contact.

Pins 14 and target points 51 and 52 are typically of circular cross sectional shape for more efficient sensing and processing by camera 16 and vision system 17. However, pins 14 and target points 51 and 52 may have any suitable cross sectional shape as desired.

Object 11 and carrier 12 are shown with a rectangular perimetric shape. However, each may have any suitable geometric, e.g. other polygonal, oval, etc., perimetric shape as desired. Each may also have other components thereon and specially shaped and/or stepped areas, etc. (not shown), or may be constituted as any desired type object or carrier, depending on their purpose.

While the orientation of pins 14 is shown in contact with carrier upper and left edges 36 and 38, pins 14 may be arranged to contact any suitable pair of adjacent edges of carrier 12.

Holder 13 may be provided with a series of carrier cavities (not shown) each containing a set of three pins 14 and sized to receive an associated carrier 12 in positive contact with the pins and with clearance between the carrier and the surrounding cavity wall. In like manner, holder 13 may have a corresponding series of object cavities (not shown) each sized to receive an object 11 in unhindered manner for pick up by vertical mechanism 23 and placement on an associated carrier 12 in a carrier cavity.

The system of the invention provides a comparatively low cost and simple method and apparatus for precisely placing an object on a carrier, and is applicable for use with a wide range of products in an automated assembly operation, employing sensing and placing assembly 15, and in which manual effort is at most limited to operator positioning of the carriers 12 manually against their associated sets of three pins 14 on holder 13.

Since it is the positional orientation and relation between a given set of pins 14 as reference points and the abutting adjacent side edges of its associated carrier 12 as counterpart references that is controlling, the pins 14 and carrier 12 may have any desired mutually cooperating configurations. This is because the carrier X and Y coordinate axes may be oriented by vision system 17 in any desired relation to the set of pins 14 as reference points and pertinent carrier edges as counterpart references for providing the carrier frame of reference.

The same is true of the orientation of the target points 51 and 52 on the associated object 11, so long as they are both intersected by the object X' axis and one of the target points is intersected by the object Y' axis for providing the object frame of reference. This is because the object X' and Y' coordinate axes are oriented by vision system 17 to correlate them with the carrier X and Y coordinate axes, via a transformation of coordinates, as discussed above.

Because of these predetermined positional relationships, slight variation from one set of pins 14 and its associated carrier 12 to the next, will not detract from the positioning accuracy of the corresponding placement operations using the system of the invention. This is because each set of pins 14 and each associated set of target points 51 and 52 are sensed in each given placement operation for placing an object 11 on its associated carrier 12.

Accordingly, it can be appreciated that the specific embodiments described are merely illustrative of the general principles of the invention. Various modifications may be provided consistent with the principles set forth.

What is claimed is:

1. A method for placing an object on a carrier comprising the steps of:

providing:
- a carrier having peripheral edge portions defining an alignment portion;
- a holder having prepositioned spaced apart stationary stops defining a positioning structure for engaging the alignment portion of the carrier such that the alignment portion engages the stops to provide the carrier in a predetermined fixed relation to the stops; and
- an object having spaced apart target points prepositioned at predetermined locations thereon;

disposing the carrier on the holder such that the alignment portion engages the stops to provide the carrier in said predetermined fixed relation to the stops;

sensing the positions of the stops on the holder and the positions of the target points on the object; and placing the object on the carrier in dependence upon the sensed stop positions and sensed target point positions such that the target points are each in a preselected position relative to the stops and the stop engaged alignment portion.

2. The method of claim 1 wherein the object is a semiconductor device having two spaced apart target points and an image sensor comprising a predetermined array of active pixel imaging elements including a first imaging element positioned at a predetermined location relative to the target points, the carrier is a ceramic substrate assembly having peripheral edge portions including adjacent first and second edges defining an alignment corner therebetween, and the stops comprise three stationary pins defining a cornering structure for engaging the alignment corner such that when the alignment corner engages the pins and the device is placed on the substrate assembly, the target points and first imaging element are each in a preselected position relative to the pins and the first and second edges defining the alignment corner.

3. The method of claim 2 wherein the substrate assembly is a multilayer assembly comprising top, middle and bottom layers and having a top layer with peripheral edges independent of the peripheral edges of the middle and bottom layers therebelow, and the pins have a corresponding to player engaging shank portion and are recessed along the shank portions thereof adjacent the remaining layers of the assembly, such that the top layer engaging shank portions of the pins engage the top layer peripheral edges while the recessed shank portions of the pins prevent engagement thereof with the peripheral edges of the remaining layers.

4. The method of claim 1 further comprising establishing a carrier coordinate system defining a carrier frame of reference relative to the sensed stop positions and the stop engaged alignment portion; establishing an object coordinate system defining an object frame of reference relative to the sensed target point positions; effecting a transformation of coordinates correlating the object coordinate system to the carrier coordinate system for locating the object within the carrier frame of reference; and placing the object on the carrier in accordance with the transformation of coordinates such that the target points are each in said preselected position relative to the stops and the stop engaged alignment portion.

5. A method for placing semiconductor devices on corresponding ceramic substrate assemblies comprising the steps of:

providing:
- a plurality of ceramic substrate assemblies each having peripheral edge portions including adjacent first and second edges defining an alignment corner therebetween;
- a holder having an associated plurality of sets of three prepositioned spaced apart stationary pins of predetermined cross section and defining a cornering structure for engaging the alignment corner of a corresponding substrate assembly such that the alignment corner of each substrate assembly engages the three pins, of an associated set to provide the substrate assembly in a predetermined fixed relation to the pins; and
- an associated plurality of semiconductor devices each having two spaced apart target points prepositioned at predetermined locations thereon; and with respect to each substrate assembly and an associated set of pins and an associated semiconductor device:

disposing the substrate assembly on the holder such that the alignment corner engages the pins to provide the substrate assembly in said predetermined fixed relation to the pins;

sensing the positions of the pins on the holder by sensing their cross sections and determining their center points and the center point positions, and sensing the positions of the target points on the semiconductor device; and placing the semiconductor device on the substrate assembly in dependence upon the sensed and determined pin center point positions and the sensed target point positions such that the target points are each in a preselected position relative to the pin center points and the pin engaged first and second edges defining the alignment corner.

6. The method of claim 5 wherein with respect to each substrate assembly and its associated set of pins, the substrate assembly is a multilayer assembly comprising top, middle and bottom layers and having a top layer with peripheral edges independent of the peripheral edges of the middle and bottom layers therebelow, and the pins have a corresponding top layer engaging shank portion and are recessed along the shank portions thereof adjacent the remaining layers of the assembly, such that the top layer engaging shank portions of the pins engage the top layer peripheral edges while the recessed shank portions of the pins prevent engagement thereof with the peripheral edges of the remaining layers.

7. Apparatus for placing an object on a carrier comprising:
  a holder adapted for disposing thereon a carrier having peripheral edge portions defining an alignment portion, the holder having prepositioned spaced apart stationary stops defining a positioning structure for engaging the alignment portion of the carrier such that the alignment portion engages the stops to provide the carrier in a predetermined fixed relation to the stops for placing on the carrier an object having spaced apart target points prepositioned at predetermined locations thereon; and
  sensing and placing means for sensing the positions of the stops on the holder and the positions of the spaced apart target points prepositioned at predetermined locations on the object to be placed on such a so disposed carrier, and for placing the object on the carrier in dependence upon the sensed stop positions and sensed target point positions such that the target points are each in a preselected position relative to the stops and the stop engaged alignment portion.

8. The apparatus of claim 7 in combination with a carrier having peripheral edge portions defining an alignment portion for so engaging the stops on the holder, and an object having spaced apart target points prepositioned at predetermined locations thereon.

9. The apparatus of claim 7 wherein the sensing and placing means comprises means for optically sensing the positions of the stops and target point positions on such an object, means for establishing a carrier coordinate system defining a carrier frame of reference relative to the sensed stop positions and the stop engaged alignment portion of such a carrier, for establishing an object coordinate system defining an object frame of reference relative to the sensed target point positions of such an object, for effecting a transformation of coordinates correlating the object coordinate system to the carrier coordinate system for locating such object within the carrier frame of reference, and for placing such object on such carrier in accordance with the transformation of coordinates such that the target points are in said preselected position relative to the stops and the stop engaged alignment portion of such carrier.

10. The apparatus of claim 7 wherein the holder has a plurality of sets of prepositioned spaced apart stationary stops, each set defining a positioning structure for engaging the alignment portion of a carrier.

11. The apparatus of claim 10 wherein the stops of each set comprise three stationary pins.

12. The apparatus of claim 11 wherein each pin is an upright pin having a lower end affixed to the holder, an upper free end and a shank extending between the ends, a portion of the shank being recessed at a predetermined location spaced a predetermined distance from the upper free end.

13. The apparatus of claim 7 wherein the stops comprise three stationary pins.

14. The apparatus of claim 13 wherein each pin is an upright pin having a lower end affixed to the holder, an upper free end and a shank extending between the ends, a portion of the shank being recessed at a predetermined location spaced a predetermined distance from the upper free end.

* * * * *